United States Patent
Li et al.

(10) Patent No.: US 11,519,970 B2
(45) Date of Patent: Dec. 6, 2022

(54) SERVER CABINET POWER BACKUP SYSTEM AND TESTING METHOD THEREOF

(71) Applicant: BEIJING BAIDU NETCOM SCIENCE AND TECHNOLOGY CO., LTD., Beijing (CN)

(72) Inventors: Xiaobin Li, Beijing (CN); Xiaozhong Li, Beijing (CN); Bin Yi, Beijing (CN); Binghua Zhang, Beijing (CN)

(73) Assignee: BEIJING BAIDU NETCOM SCIENCE AND TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 17/249,069

(22) Filed: Feb. 18, 2021

(65) Prior Publication Data
US 2021/0333329 A1 Oct. 28, 2021

(30) Foreign Application Priority Data
Apr. 26, 2020 (CN) .................... 202010338987.3

(51) Int. Cl.
*G01R 31/392* (2019.01)
*G01R 31/387* (2019.01)
*G01R 31/389* (2019.01)

(52) U.S. Cl.
CPC ......... *G01R 31/392* (2019.01); *G01R 31/387* (2019.01); *G01R 31/389* (2019.01)

(58) Field of Classification Search
None
See application file for complete search history.

(56) References Cited

U.S. PATENT DOCUMENTS

2006/0017444 A1 1/2006 Fechalos et al.
2006/0049798 A1* 3/2006 Yang ............... G01R 19/16542
320/112
(Continued)

FOREIGN PATENT DOCUMENTS

CN 102902341 A 1/2013
CN 109884536 A 6/2019
(Continued)

OTHER PUBLICATIONS

Extended European Search Report dated Aug. 13, 2021 for European Patent Application No. 21158681.3. 8 pages.
(Continued)

*Primary Examiner* — Jas A Sanghera
(74) *Attorney, Agent, or Firm* — Knobbe, Martens, Olson & Bear, LLP

(57) ABSTRACT

Embodiments of the present disclosure provide a server cabinet power backup system and a testing method thereof. In a self-test process of the power backup unit, the battery management module may be configured to: control the battery pack to supply power to the self-test resistor to discharge the battery pack, control the battery pack to be charged after the battery pack is discharged, and collect a charge and discharge parameter of the battery pack, and the battery management module may be further configured to: determine attenuation performance of the power backup unit according to the charge and discharge parameter of the battery pack.

14 Claims, 4 Drawing Sheets

(56) References Cited

U.S. PATENT DOCUMENTS

| | | | |
|---|---|---|---|
| 2013/0030735 A1* | 1/2013 | Jau | G01R 31/385 702/63 |
| 2013/0031382 A1 | 1/2013 | Jau et al. | |
| 2014/0088896 A1* | 3/2014 | Hu | G01R 31/3835 702/63 |
| 2016/0341798 A1 | 11/2016 | Fetzer et al. | |
| 2019/0168617 A1 | 6/2019 | Ling et al. | |

FOREIGN PATENT DOCUMENTS

| | | |
|---|---|---|
| CN | 110707804 A | 1/2020 |
| JP | H 08233916 | 9/1996 |
| JP | 2011125123 | 6/2011 |
| JP | 2011200023 | 10/2011 |

OTHER PUBLICATIONS

Japanese Office Action dated Jul. 5, 2022 from related JP App. No. 2021-035694 (4 pgs).

Chinese Office Action dated Dec. 30, 2021 for Chinese Patent Application No. 202010338987.3.

\* cited by examiner

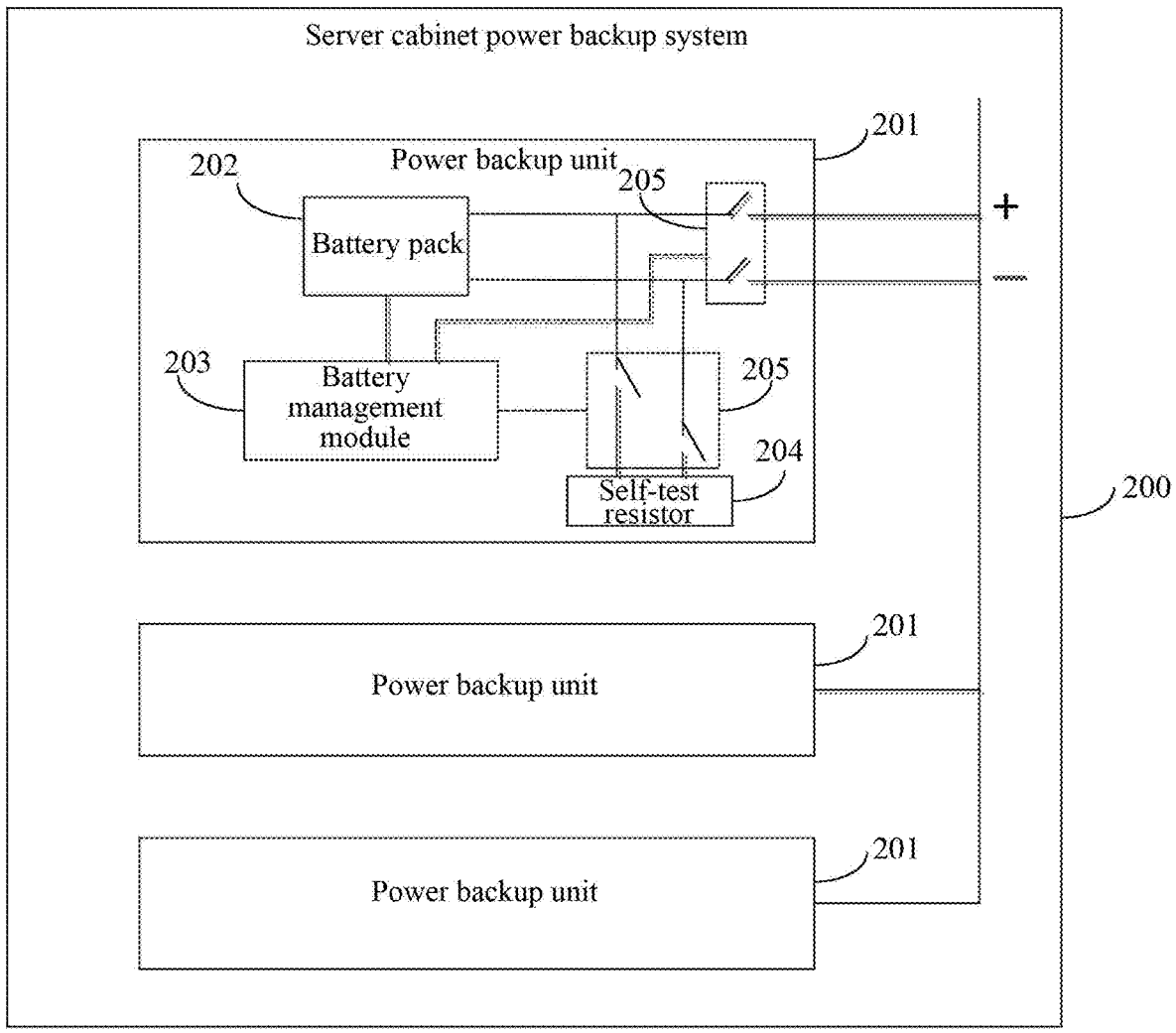

Fig. 2

In a self-test process of a power backup unit, a battery management module controls a battery pack to supply power to a self-test resistor to discharge the battery pack, and controls the battery pack to be charged after the battery pack is discharged, and collects a charge and discharge parameter of the battery pack — S310

Battery management module determines attenuation performance of the power backup unit according to the charge and discharge parameter of the battery pack — S320

Fig. 3

SERVER CABINET POWER BACKUP SYSTEM AND TESTING METHOD THEREOF

CROSS-REFERENCE TO RELATED APPLICATIONS

This application claims priority to Chinese Patent Application No. 202010338987.3, filed on Apr. 26, 2020, titled "Server cabinet power backup system and testing method thereof," which is hereby incorporated by reference in its entirety.

TECHNICAL FIELD

Embodiments of the present disclosure relate to the field of mechanical and electrical technology, specifically to a power backup technology, and more specifically to a server cabinet power backup system and a testing method thereof.

BACKGROUND

With the increase of use time and the increase of number of cycles, the capacity and the internal resistance of a battery would gradually attenuate, and the discharge time of a backup battery becomes shorter and shorter. In order to determine the degree of attenuation of the battery, obtain the reliable discharge time of the battery, and ensure the reliable operation of a server cabinet, it is required to periodically perform a self-test on a battery of a backup power supply system.

SUMMARY

A server cabinet power backup system and a testing method thereof are provided.

According to a first aspect, a server cabinet power backup system is provided. The system includes a plurality of power backup units connected in parallel. Each power backup unit includes a battery pack, a battery management module and a self-test resistor, and the self-test resistor is connected in parallel with a charge loop of the battery pack. In a self-test process of the power backup unit, the battery management module is configured to: control the battery pack to supply power to the self-test resistor to discharge the battery pack, control the battery pack to be charged after the battery pack is discharged, and collect a charge and discharge parameter of the battery pack, and the battery management module is further configured to: determine attenuation performance of the power backup unit according to the charge and discharge parameter of the battery pack.

According to a second aspect, a method for testing a server cabinet power backup system is provided. The method is performed by the server cabinet power backup system. The server cabinet power backup system includes a plurality of power backup units connected in parallel, each power backup unit includes a battery pack, a battery management module and a self-test resistor, the self-test resistor is connected in parallel with a charge loop of the battery pack. The method includes: in a self-test process of the power backup unit, controlling, by the battery management module, the battery pack to supply power to the self-test resistor to discharge the battery pack, controlling the battery pack to be charged after the battery pack is discharged, and collecting a charge and discharge parameter of the battery pack, and determining, by the battery management module, attenuation performance of the power backup unit according to the charge and discharge parameter of the battery pack.

It should be understood that the description in this section is not intended to identify key or critical features of the embodiments of the disclosure, nor is it intended to limit the scope of the disclosure. Other features of the present disclosure will become readily apparent from the following description.

BRIEF DESCRIPTION OF THE DRAWINGS

Accompanying drawings are used for a better understanding of the scheme, and do not constitute a limitation to the present disclosure.

FIG. 2 is a schematic structural diagram of a server cabinet power backup system according to an embodiment of the present disclosure;

FIG. 3 is a schematic flowchart of a method for testing a server cabinet power backup system according to an embodiment of the present disclosure;

DETAILED DESCRIPTION OF EMBODIMENTS

Example embodiments of the present disclosure are described below in combination with accompanying drawings, and various details of embodiments of the present disclosure are included in the description to facilitate understanding, and should be considered as an example. Accordingly, it should be recognized by one of ordinary skill in the art that various changes and modifications may be made to the embodiments described herein without departing from the scope and spirit of the present disclosure. Also, for clarity and conciseness, descriptions for well-known functions and structures are omitted in the following description.

Figure 1:
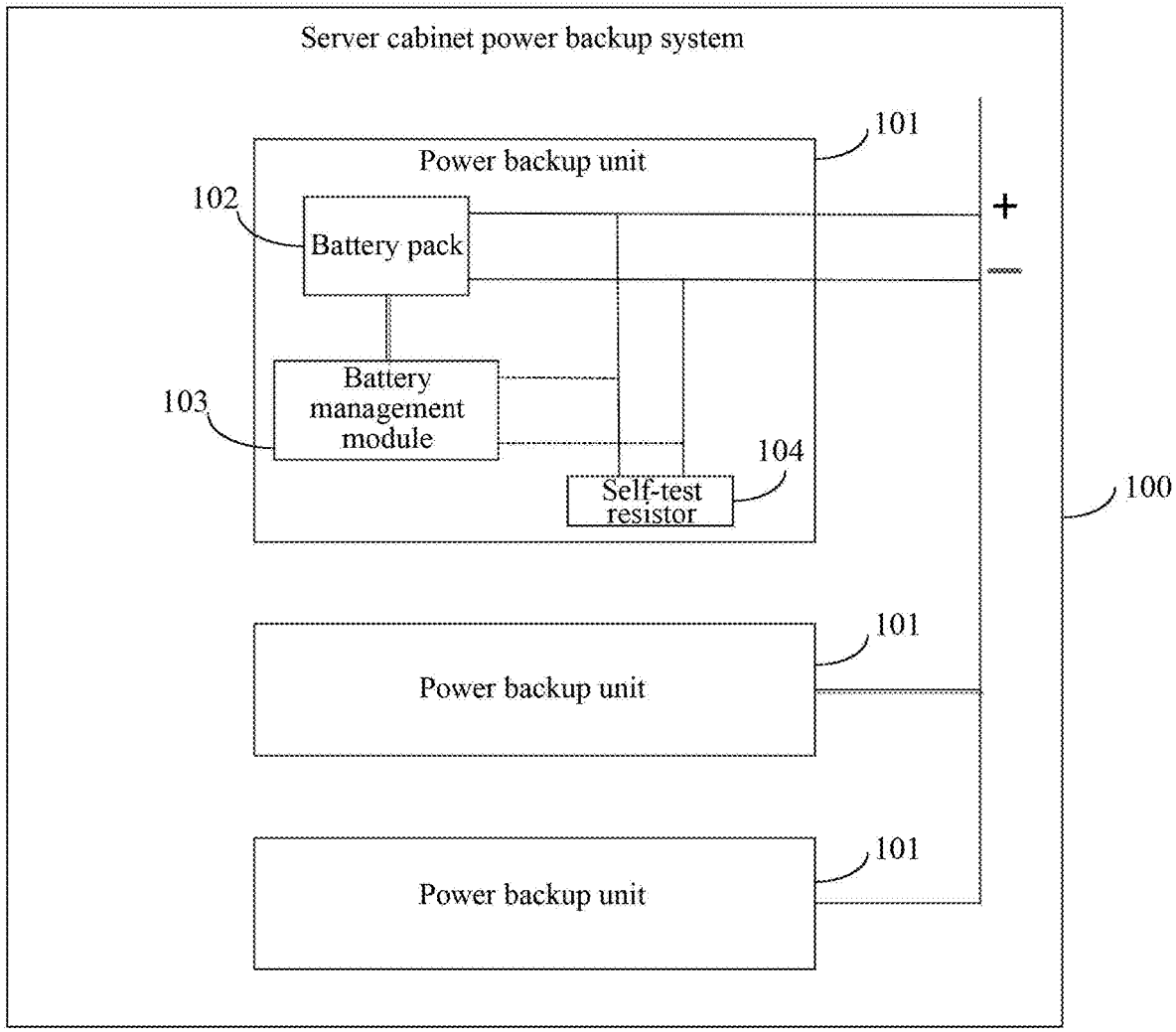
FIG. 1 is a schematic structural diagram of a server cabinet power backup system according to an embodiment of the present disclosure.

FIG. 1 is a schematic structural diagram of a server cabinet power backup system provided according to an embodiment of the present disclosure, which may perform a method for testing the server cabinet power backup system provided in an embodiment of the present disclosure. As shown in FIG. 1, the system 100 may include: a plurality of power backup units 101 connected in parallel. The power backup units 101 include a battery pack 102, a battery management module 103, and a self-test resistor 104. The self-test resistor 104 is connected in parallel with a charge loop of the battery pack 102, and the battery management module 103 controls a connection and a disconnection between the battery pack 102 and the self-test resistor 104.

In the self-test process of the power backup unit 101, the battery management module 103 is configured to: control the battery pack 102 to supply power to the self-test resistor 104 to discharge the battery pack 102, control the charge loop to charge the battery pack 102 after the battery pack 102 is discharged, and collect a charge and discharge parameter of the battery pack 102. The charge loop is a loop for charging the battery pack 102.

Specifically, the self-test of the power backup units 101 refers to a test on the attenuation performance of a battery of the power backup unit 101. Here, the attenuation performance refers to a performance loss parameter of a power backup unit in use, and may be calculated according to data such as a charge and discharge capacity and charge and discharge time of the battery pack 102 in the power backup units 101. In the self-test, the power backup unit 101 needs to discharge the battery pack 102 first, for example, may discharge the battery pack 102 from 100% to 50%. When the battery management module 103 responds to a self-test instruction, it is possible to control the battery pack 102 through a circuit represented by a dashed line in FIG. 1, to connect with the self-test resistor 104, such that the battery pack 102 transmits power to the connected self-test resistor 104 and is disconnected from the connected charge loop, the charge loop referring to positive and negative lines to which the battery pack 102 is connected. The self-test instruction may be issued by a worker or may be issued automatically at predetermined self-test time. When controlling the battery pack to be discharged, the battery management module 103 may collect a discharge parameter of the battery pack 102. The discharge parameter may include a parameter such as a discharge capacity and discharge time.

When the discharge of the battery pack 102 ends, the battery management module 103 may control the battery pack 102 through the circuit represented by the dashed line in FIG. 1 to disconnect from the self-test resistor 104, such that the battery pack 102 is charged through the charge loop in FIG. 1 that is connected with the battery pack 102, for example, may be charged from 30% to 80%. When the battery pack 102 is charged, the battery management module 103 may collect a charge parameter of the battery pack 102. The charge parameter may include a parameter such as a charge capacity and charge time.

The battery management module 103 is further configured to determine the attenuation performance of the power backup unit 101 according to the charge and discharge parameter of the battery pack 102.

Specifically, the charge and discharge parameter may include a discharge parameter and a charge parameter of the battery pack 102, or may include a parameter such as a current, a voltage, and an internal resistance collected by the battery management module 103 in the discharge process and charge of the power backup unit 101. After the battery management module 103 collects the charge and discharge parameter of the battery pack 102, the attenuation performance of the power backup unit 101 is obtained by performing a calculation according to the charge and discharge parameter. The attenuation performance refers to the performance loss parameter of the power backup unit in use. For example, the attenuation performance may include a parameter of the battery pack 102 such as a capacity and a resistance, or may refer to a parameter of the battery such as an SOC (State of Charge) and an SOH (State of Health).

In this embodiment, alternatively, the battery management module is specifically configured to determine a dischargeable capacity and discharge time of the power backup units in the self-test process according to the charge and discharge parameter of the battery pack. The battery management module is further specifically configured to determine a dischargeable capacity and discharge time of the power backup units at rated power according to the dischargeable capacity and the discharge time of the power backup units in the self-test process.

Specifically, after collecting the charge and discharge parameter, the battery management module 103 determines, from the charge and discharge parameter, a dischargeable capacity and discharge time of the battery pack 102 in the self-test process. According to the dischargeable capacity and the discharge time of the battery pack 102 in the self-test process, the battery management module 103 may perform a parameter calculation at the rated power, to determine a dischargeable capacity and discharge time of the battery pack 102 at rated load power, thereby obtaining the attenuation performance of the battery pack 102. For example, the battery management module 103 determines a dischargeable capacity and discharge time of the power backup units 101 at low power in the self-test process according to the charge and discharge parameter, and determines a dischargeable capacity and discharge time of the power backup unit 101 at the rated load power according to the dischargeable capacity and the discharge time at the low power. The dischargeable capacity and the discharge time at the rated power refer to reductions of the dischargeable capacity and the discharge time at the low power. A variation of the capacity, the internal resistance, etc. of the battery pack 102 may be obtained according to the charge and discharge cycle of the load of the self-test resistor 104, thereby obtaining the SOC and the SOH of the power backup unit 101 at the low power. According to a conversion algorithm between a low-power discharge and a high-power discharge, the SOC and the SOH of the power backup unit 101 at the rated power are obtained. The beneficial effect of such setting lies in that, a reference for calculating the dischargeable capacity and the discharge time of a power backup unit at the rated power is obtained by collecting the dischargeable capacity and the discharge time of the power backup unit in the self-test process, which can reduce a calculation error, thereby improving the calculation precision and the calculation efficiency of the self-test.

An embodiment of the present disclosure has the following advantages or beneficial effects: a self-test resistor is connected in parallel in the power backup unit, and the battery management module controls the battery pack to be connected with or disconnected from the self-test resistor, so as to charge and discharge the battery pack, and the charge and discharge parameter can be collected to calculate the attenuation performance of the battery. This solves the problem in the existing technology that a test is manually performed on the battery. The self-test is completely and automatically performed through the power backup system, thus saving operation and maintenance costs. Each power backup unit operates independently and does not affect the stability of an other power backup unit or the server. By connecting the self-test resistor, the deep discharge of the battery pack can be implemented in the self-test process, and thus, the attenuation of the battery is completely understood, and the accuracy of the self-test is improved.

FIG. 2 is a schematic structural diagram of a server cabinet power backup system provided according to an embodiment of the present disclosure. This embodiment is further optimized on the basis of the above embodiment. As shown in FIG. 2, the server cabinet power backup system 200 provided in this embodiment may include: a plurality of power backup units 201 connected in parallel. Each power backup unit 201 includes a battery pack 202, a battery management module 203, a self-test resistor 204 and a switching circuit 205. The self-test resistor 204 is connected in parallel with a charge loop of the battery pack 202. The switching circuit 205 is configured to connect the battery pack 202 and the self-test resistor 204, or disconnect the battery pack 202 from the self-test resistor 204. The switching circuit 205 is also configured to connect the battery pack 202 and a bus of a server load, or disconnect the battery pack 202 from the bus of the server load. The battery pack 202 may be connected with the bus of the server load through the charge loop, and the switching of the switching circuit 205 is controlled by the battery management module 203.

In this embodiment, alternatively, a resistance value of the self-test resistance is determined according to at least one item of: a self-test discharge duration of the battery pack, heat generated by the self-test resistor in a discharge process, or a size of the power backup units.

Specifically, when a discharge self-test is performed on the power backup unit 201 using the self-test resistor 204, the resistance value of the self-test resistor 204 is restricted in at least three aspects, including the self-test discharge duration of the battery pack 202, the heat generated by the self-test resistor 204 in the discharge process, and the size of the power backup unit 201. The discharge time of the battery pack 202 is controlled to be within preset time. For example, a self-test resistor of which the discharge time is within two hours may be selected. If the discharge time is too long, the self-test efficiency would be affected. If the discharge time is too short, the calculation reliability of the attenuation performance would be reduced. Excessive heat generated by the self-test resistor 204 should be avoided to improve the safety guarantee of the self-test process, and the risk caused by an excessive temperature in a server cabinet should be avoided. The server cabinet has only 2u-3u (unit, an external size unit of a server) for placing the power backup units 201, and the space inside the power backup units 201 is very compact, and thus the self-test resistor 204 cannot occupy too much space, which ensures that the power backup units 201 may provide space for an other device and enables the power backup units 201 to effectively dissipate heat, thereby improving the self-test efficiency.

In this embodiment, alternatively, the battery management module is specifically configured to control the battery pack to be fully charged and fully discharged.

Specifically, the battery management module 203 is an important part of the server cabinet power backup system 200, and may control a switching between the battery pack 202 and the self-test resistor 204. When the battery pack 202 starts a self-test, the battery management module 203 connects the battery pack 202 and the self-test resistor 204, and controls the battery pack 202 to discharge to the self-test resistor 204. After the discharge of the battery pack 202 completely ends, the battery management module 203 disconnects the connection between the battery pack 202 and the self-test resistor 204, and controls the charge loop to charge the battery pack 202. After the battery pack 202 is fully charged, the battery management module 203 starts to calculate the attenuation performance of the power backup units 201. Therefore, the battery management module 203 may control the battery pack 202 to be fully charged and fully discharged, and manual operation steps are reduced through the control of the battery management module 203. This solves the problem in the existing technology that a full charge and a full discharge cannot be performed. According to the existing self-test discharge technology, a part of the capacity can only be released, for example, 30%-50%, resulting in a low accuracy in evaluating the overall discharge performance of the battery. In this embodiment, the full charge and the full discharge of the battery pack 202 are implemented through the self-test resistor 204, and a more precise battery attenuation parameter may be obtained using a charge and discharge parameter in the situations of the full charge and the full discharge, thereby improving the calculation precision.

In this embodiment, alternatively, the power supply unit further includes the switching circuit. The battery management module is specifically configured to, through the switching circuit, control the battery pack to be disconnected from the bus of the server load and control the battery pack to be communicated with the self-test resistor to discharge the battery pack using the self-test resistor. After the battery pack is discharged, the battery management module is further specifically configured to, through the switching circuit, control the battery pack to be disconnected from the self-test resistor, and control the battery pack to be communicated with the charge loop to charge the battery pack using the charge loop.

Specifically, the switching circuit 205 is controlled by the battery management module 203 to be on and off. The switching circuit 205 may include a switching circuit 205 which is connected and disconnected between the self-test resistor 204 and the positive and negative electrodes of the charge loop of the battery pack 202, and is controlled by the battery management module 203 to be on and off; and may also include a switching circuit 205 which is on the charge loop between the battery pack 202 and the server load, and is controlled by the battery management module 203 to be on and off.

When the battery pack 202 is discharged, the battery management module 203 disconnects the connection between the battery pack 202 and the charge loop, controls the switching circuit 205 of the battery pack 202 on the charge loop to be disconnected, and electronically communicates the switching circuit 205 between the battery pack 202 and the self-test resistor 204, such that the discharge of the battery pack 202 is realized by the self-test resistor 204. After the discharge of the battery pack 202 ends, the battery management module 203 controls the switching circuit 205 between the battery pack 202 and the self-test resistor 204 to be disconnected, such that the communication between the battery pack 202 and the charge loop is restored and the battery pack 202 is charged by the charge loop, which avoids that battery pack 202 discharges to the self-test resistor while being charged, thereby improving the charging efficiency. When the battery pack 202 is charged or after the charge of the battery pack 202 ends, the connection of the switching circuit 205 between the battery pack 202 and the server load is restored.

By disconnecting the connection between the battery pack 202 and the server load during the discharge, the mutual independence of the battery pack 202 and the server load in the discharge process is achieved. In a charge and discharge process, the self-test resistor 204 is controlled to be disconnected from the battery pack 202, such that the battery pack 202 is discharged through the self-test resistor 204, thus implementing the deep discharge of the battery pack and improving the calculation precision of the attenuation performance of the battery. Moreover, the self-test is performed by a single power backup unit 201, which does not affect an other power backup unit 201, and the self-test process is completely isolated from the server and thus does not affect the server, which avoids an introduction of a new potential safety hazard. In addition, it is not required to be configured with an expensive DC/DC (direct current-to-direct current power supply), and the investment cost is effectively saved by using the self-test resistor.

In this embodiment, alternatively, the battery management module is further configured to determine whether a self-test condition of the power backup unit is satisfied when it is tested that the self-test time of the power backup unit is reached. In response to the self-test condition being satisfied, the battery management module is further configured to perform a self-test operation on the power backup unit.

Specifically, the triggering of the self-test process may be performed manually by a worker, and the battery management module 203 is controlled to start a self-test on the power backup unit 201. The self-test condition may also be preset, and the battery management module 203 tests the state of the power backup unit 201. When the power backup unit 201 satisfies the self-test condition, the battery management module 203 automatically starts to perform the self-test on the power backup unit 201. Self-test time may be preset, and the self-test time refers to time at which the battery management module 203 tests whether the power backup unit 201 satisfies the self-test condition. When the self-test time is reached, the battery management module 203 starts to test whether the power backup unit 201 satisfies the self-test condition. The self-test condition is a condition that the battery management module 203 confirms the start of the self-test. The self-test condition may be to test whether the battery level of the power backup unit 201 satisfies a preset battery level, or may be to test whether the power backup unit 201 may operate normally. By setting the self-test time and the self-test condition, an automatic test of the power backup unit 201 may be implemented, which reduces the manual operations, saves the operation and maintenance costs, and improves the self-test efficiency.

In this embodiment, alternatively, the battery management module is specifically configured to determine that the self-test condition of the power backup unit is satisfied, in response to the battery management module testing that a mains supply being normal, a power supply module of the server cabinet being normal, and a number of available power backup units in the power backup system is greater than a threshold value.

Specifically, the self-test condition may include a state of the mains supply, a state of the power supply module PSU (power supply unit) of the server cabinet, the number of the available power backup units 201 in the power backup system, and the like. If the battery management module 203 tests that the state of the mains supply satisfies a preset state, the state of the power supply module PSU of the server cabinet satisfies a preset state, and the number of the available power backup units 201 in the power backup system satisfies a preset numerical value, it is determined that the power backup unit 201 satisfy the self-test condition. The state of the mains supply may include a normal state and an abnormal state, and the normal state is used as the preset state of the state of the mains supply. The state of the power supply module of the server cabinet may include a normal state and an abnormal state, and the normal state is used as the preset state of the power supply module of the server cabinet. A threshold value of the number of the available power backup units 201 in the power backup system may be preset. When the number of the available power backup units 201 in the power backup system is greater than the threshold value, it is determined that the number of the available power backup units 201 in the power backup system satisfies the preset numerical value. The power backup units 201 may adopt a configuration of N+X, and the threshold value of the number is set to N+X. N represents the number of power supply units used in the server cabinet power backup system 200, and X is a natural number greater than or equal to 0. It is ensured that the redundancy of the server cabinet power backup system 200 is sufficient. That is, there are N or more available power backup units 201 in the server cabinet power backup system 200. It is ensured that at least N power backup units 201 can supply power to the server load when an abnormality of the mains supply suddenly occurs. By setting the self-test condition, the start standard of the self-test is improved, the failure occurring in a self-test process under a low standard is avoided, the security of the self-test is ensured, and the efficiency of the self-test is improved.

An embodiment of the present disclosure has the following advantages or beneficial effects: a self-test resistor is connected in parallel in the power backup unit, and the battery management module controls the battery pack to be connected with or disconnected from the self-test resistor, so as to charge and discharge the battery pack, and the charge and discharge parameter can be collected to calculate the performance of the battery. By providing the switching circuit, the self-test is automatically performed, thus reducing manual operations. This solves the problem in the existing technology that a test is manually performed on the battery. The self-test is completely and automatically performed through the power backup system, thus saving operation and maintenance costs. Each power backup unit operates independently and does not affect the stability of another power backup unit or the server. By connecting the self-test resistor, the deep discharge of the battery pack can be implemented in the self-test process, and thus, the attenuation situation of the battery is completely understood, and the accuracy of the self-test is improved.

FIG. 3 is a schematic flowchart of a method for testing a server cabinet power backup system provided according to an embodiment of the present disclosure. This embodiment is used for a situation where a server cabinet power backup system is tested, and the method may be performed by an apparatus for testing a server cabinet power backup system. The apparatus is configured with a server cabinet power backup system, the server cabinet power backup system including a plurality of power backup units connected in parallel. Each power backup unit includes a battery pack, a battery management module, and a self-test resistor, and the self-test resistor is connected in parallel with a charge loop of the battery pack. The apparatus may be implemented by means of software and/or hardware, and may be integrated in an electronic device having a calculation capability. As shown in FIG. 3, the method for testing a server cabinet power backup system provided in this embodiment may include the following steps.

S310, in a self-test process of the power backup units, the battery management module controls the battery pack to supply power to the self-test resistor to discharge the battery pack, and controls the battery pack to be charged after the battery pack is discharged, and collects a charge and discharge parameter of the battery pack.

Here, the battery management module performs a self-test for the power backup units after receiving a self-test instruction. The battery pack in the power backup unit is not electronically communicated with the self-test resistor before the self-test. When the battery management module starts to perform the self-test for the power supply unit, a self-test marker bit of the battery management module is set to electronically communicate the battery pack with the self-test resistor, such that the battery pack delivers power to the self-test resistor and the connection between the battery pack and the charge loop is disconnected, thereby realizing a deep discharge of the battery pack. When the discharge of the battery pack ends, the battery management module controls the battery pack to be disconnected from the self-test resistor, which stops the discharge of the battery pack. The battery management module controls the battery pack to be connected with the charge loop, to charge the battery pack through the charge loop, and resets the self-test marker bit. The battery management module collects the charge and discharge parameter of the battery pack in the charge and discharge process of the battery pack, for example, may collect a parameter such as time, an electric current, a voltage, and an internal resistance in the charge and discharge process of the battery pack. Thus, the manual process of collecting the parameter is reduced, and the self-test automation is realized.

S320, the battery management module determines attenuation performance of the power backup unit according to the charge and discharge parameter of the battery pack.

Here, with the increase of use time and the increase of number of cycles, the capacity and the internal resistance of the power backup unit would attenuate gradually, and the backup discharge time of the power backup unit becomes shorter and shorter. Thus, the performance loss parameter of the power backup unit in use may be represented by the attenuation performance, and the attenuation performance may include a discharge capacity and discharge time of the power backup unit at target power. The target power may be rated power. After collecting the charge and discharge parameter of the battery pack, the battery management module calculates performance of the power backup units at low power in the self-test process according to a preset calculation formula, and may calculate the attenuation performance of the power backup unit at the target power according to the performance at the low power.

An embodiment of the present disclosure has the following advantages or beneficial effects: the battery management module controls the battery pack to be connected with or disconnected from the self-test resistor, so as to charge and discharge the battery pack, and the charge and discharge parameter may be collected to calculate the attenuation performance of the battery. This solves the problem in the existing technology that a test is manually performed on the battery. The self-test is completely and automatically performed through the power backup system, thus saving operation and maintenance costs. Each power backup unit operates independently and does not affect the stability of another power backup unit or the server. By connecting the self-test resistor, the deep discharge of the battery pack can be implemented in the self-test process, and thus, the attenuation of the battery is completely understood, and the accuracy of the self-test is improved.

Figure 4:
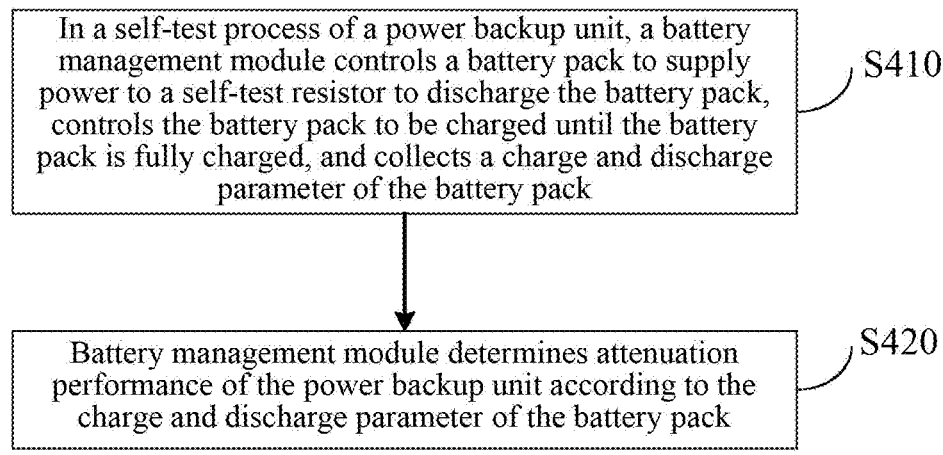
FIG. 4 is a schematic flowchart of a method for testing a server cabinet power backup system according to an embodiment of the present disclosure.

FIG. 4 is a schematic flowchart of a method for testing a server cabinet power backup system provided according to an embodiment of the present disclosure. This embodiment is further optimized on the basis of the above embodiment.

In this embodiment, alternatively, the battery management module controls the battery pack to supply power to the self-test resistor to discharge the battery pack, and controls the battery pack to be charged after the battery pack is discharged. This process includes: the battery management module controls the battery pack to supply power to the self-test resistor to discharge the battery pack, and controls the battery pack to be charged until the battery pack is fully charged, after the battery pack is fully discharged.

As shown in FIG. 4, the method for testing a server cabinet power backup system provided in this embodiment may include the following steps.

S410, in a self-test process of the power backup unit, the battery management module controls the battery pack to supply power to the self-test resistor to discharge the battery pack, controls, after the battery pack is fully discharged, the battery pack to be charged until the battery pack is fully charged, and collects a charge and discharge parameter of the battery pack.

Here, the battery management module controls the battery pack to be discharged by connecting the self-test resistor and the battery pack, disconnects the connection between the battery pack and the self-test resistor until the battery pack is fully discharged, and then charges the battery pack through the charge loop. The charge and discharge parameter collected by the battery management module is a parameter of the battery pack in the situations of full-charge and full-discharge. The full-charge refers to that the battery pack is charged to 100%, and the full-discharge refers to that the battery pack is discharged to 0%. By controlling the battery pack to be fully charged and fully discharged, the charge and discharge parameter of the power backup unit may be precisely collected, which solves the problem in the existing technology that only a part of the capacity of a battery can be released, reduces a calculation error, thereby improving the calculation accuracy of the attenuation performance.

In this embodiment, alternatively, a resistance value of the self-test resistance is determined according to at least one item of: a self-test discharge duration of the battery pack, heat generated by the self-test resistor in a discharge process, or a size of the power backup units.

Specifically, a self-test resistor having an appropriate resistance value is selected to be connected in parallel on the charge loop of the battery pack, and an appropriate self-test resistor may be selected according to three conditions, including the self-test discharge duration of the battery pack, the heat generated by the self-test resistor in the discharge process, and the size of the power backup unit. The resistance value of the self-test resistor directly affects the discharge duration of the battery pack. By selecting the resistance value of the self-test resistor, the discharge duration of the battery pack is controlled within a few hours. If the discharge time is too long, the self-test efficiency would be affected. If the discharge time is too short, the calculation reliability of the attenuation performance would be reduced. The self-test resistor releases heat during use. If too much heat is generated, a potential safety hazard would be caused, thus resulting in a risk caused by the excessive temperature in a server cabinet. The server cabinet has only 2u-3u for placing the power backup units, and the space inside the power backup units 201 is very compact, and thus the self-test resistor cannot occupy too much space, which ensures that the power backup units may provide space for another device and enables the power backup units to effectively dissipate heat, thereby improving the security. By selecting the appropriate self-test resistor, the safety guarantee of the self-test process may be effectively improved, and the self-test efficiency may be improved.

In this embodiment, alternatively, the power backup units further include a switching circuit. Correspondingly, the process in which the battery management module controls the battery pack to supply power to the self-test resistor to discharge the battery pack, and controls the battery pack to be charged after the battery pack is discharged includes: through the switching circuit, the battery management module controls the battery pack to be disconnected from the bus of the server load and controls the battery pack to be electronically communicated with the self-test resistor to discharge the battery pack using the self-test resistor; and after the battery pack is discharged, through the switching circuit, the battery management module further controls the battery pack to be disconnected from the self-test resistor, and controls the battery pack to be electronically communicated with the charge loop to charge the battery pack using the charge loop.

Specifically, a switching circuit may be provided at a position where the battery management module controls the battery pack to be electronically communicated with the self-test resistor, and a switching circuit may be provided at a position where the battery management module controls the battery pack to be electronically communicated with the bus of the server load. Here, the battery pack and the server load may be connected through the charge loop.

When it is confirmed that the self-test is started, the battery management module disconnects the connection between the battery pack and the charge loop to prevent the battery pack from continuing to be charged, and controls the battery pack to be disconnected from the bus of the server load through the switching circuit to realize the independence of the battery pack in the self-test process. The battery pack is controlled to be connected with the self-test resistor through the switching circuit, to transmit power to the self-test resistor, thereby implementing the discharge of the battery pack. After the discharge of the battery pack ends, the battery pack is controlled to be disconnected from the self-test resistor through the switching circuit, which avoids that battery pack discharges to the self-test resistor while being charged, thereby improving the charging efficiency. In addition, the battery pack is controlled to be electronically communicated with the charge loop, to be charged through the charge loop. When the battery pack is charged or after the charge of the battery pack ends, the connection between the battery pack and the bus of the server load is restored.

By disconnecting the connection between the battery pack and the server load during the discharge, the mutual independence of the battery pack and the server load in the discharge process is achieved. In a charge and discharge process, the self-test resistor is controlled to be disconnected from the battery pack, such that the battery pack is discharged through the self-test resistor, which implements the deep discharge of the battery pack, and improves the calculation precision of the attenuation performance of the battery. Moreover, the self-test is performed by a single power backup unit, which does not affect an other power backup unit, and the self-test process is completely isolated from the server and thus does not affect the server, which avoids an introduction of a new potential safety hazard. The investment cost may be effectively saved by using the self-test resistor.

S420, the battery management module determines attenuation performance of the power backup unit according to the charge and discharge parameter of the battery pack.

An embodiment of the present disclosure has the following advantages or beneficial effects: the battery management module controls the battery pack to be connected with or disconnected from the self-test resistor, so as to charge and discharge the battery pack, and the charge and discharge parameter may be collected to calculate the performance of the battery. This solves the problem in the existing technology that a test is manually performed on the battery. The self-test is completely and automatically performed through the power backup system, thus saving operation and maintenance costs. Each power backup unit operates independently and does not affect the stability of an other power backup unit or the server. By connecting the self-test resistor, the battery pack is fully charged and fully discharged, such that the deep discharge of the battery pack may be implemented in the self-test process. The charge and discharge parameter of the power backup units are precisely collected, which reduces a calculation error, thereby improving the calculation accuracy of the attenuation performance and the accuracy of the self-test.

Figure 5:
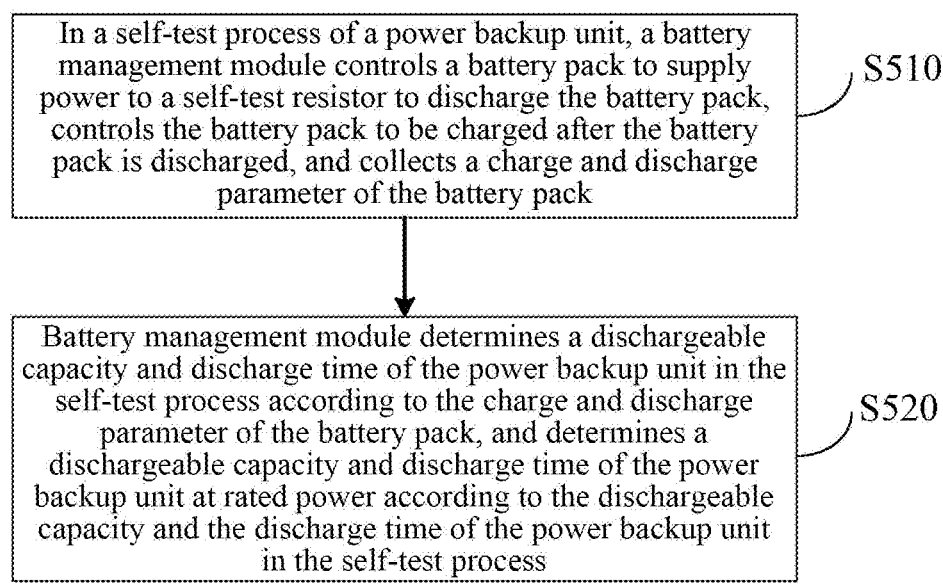
FIG. 5 is a schematic flowchart of a method for testing a server cabinet power backup system according to an embodiment of the present disclosure.

FIG. 5 is a schematic flowchart of a method for testing a server cabinet power backup system provided according to an embodiment of the present disclosure. This embodiment is further optimized on the basis of the above embodiment.

In this embodiment, alternatively, the process in which the battery management module determines the attenuation performance of the power backup unit according to the charge and discharge parameter of the battery pack includes: the battery management module determines a dischargeable capacity and discharge time of the power backup unit in a self-test process according to the charge and discharge parameter of the battery pack; and the battery management module determines a dischargeable capacity and discharge time of the power backup unit at rated power according to the dischargeable capacity and the discharge time of the power backup unit in the self-test process.

As shown in FIG. 5, the method for testing a server cabinet power backup system provided in this embodiment may include the following steps.

S510, in a self-test process of the power backup unit, the battery management module controls the battery pack to supply power to the self-test resistor to discharge the battery pack, controls the battery pack to be charged after the battery pack is discharged, and collects a charge and discharge parameter of the battery pack.

Here, the battery management module confirms the performing of the self-test of the power backup unit. The battery management module may confirm the start of the self-test by receiving a trigger instruction of a worker, or through a preset trigger condition.

In this embodiment, alternatively, the battery management module determines whether a self-test condition of the power backup unit is satisfied when it is tested that the self-test time of the power backup unit is reached. If the self-test condition is satisfied, the battery management module further performs a self-test operation on the power backup units.

Specifically, the self-test time refers to time at which the battery management module tests whether the power backup units satisfy the self-test condition. For example, the self-test time may be preset to once a quarter (i.e., a period of three months). The self-test condition refers to a condition that the battery management module confirms the start of the self-test. For example, the self-test condition may be preset to that the power backup unit may operate normally. When the self-test time is reached, the battery management module starts to test whether the power backup units satisfy the self-test condition. If the power backup unit satisfies the self-test condition, the battery management module starts to control the power backup unit to perform a self-test. Thus, the self-test is automatically implemented, the manual operation steps are reduced, and the self-test efficiency is improved.

In this embodiment, alternatively, determining whether the self-test condition of the power backup unit is satisfied includes: determining that the self-test condition of the power backup units is satisfied, in response to the battery management module testing that a mains supply is normal, a power supply module of a server cabinet is normal, and the number of available power backup units in the power backup system is greater than a threshold value.

Specifically, a self-test condition under which a self-test may be performed is preset, and the self-test condition may include a use state of the mains supply, an operation state of the power supply module of the server cabinet, the number of the available power backup units in the power backup system, etc. The threshold value of the number of the power backup units is preset to N+X, that is, the configuration of N+X is used to ensure that the redundancy of the server cabinet power backup system is sufficient. That is, there are N or more available power backup units in the server cabinet power backup system. It is ensured that at least N power backup units may supply power to a server load when an abnormality of the mains supply suddenly occurs. When the battery management module tests that the mains supply is normal, the power supply module of the server cabinet is normal, and the number of the available power backup units in the power backup system is greater than N+X, it is considered that the power backup unit satisfies the self-test condition. By setting the self-test condition, the start standard of the self-test is improved, the failure occurring in a self-test process under a low standard is avoided, the security of the self-test is ensured, and the efficiency of the self-test is improved.

S520, the battery management module determines a dischargeable capacity and discharge time of the power backup unit in the self-test process according to the charge and discharge parameter of the battery pack, and determines a dischargeable capacity and discharge time of the power backup unit at rated power according to the dischargeable capacity and the discharge time of the power backup units in the self-test process.

Here, the attenuation performance of the power backup unit may include the dischargeable capacity and the discharge time of the power backup units at the rated power. The charge and discharge parameter collected by the battery management module in the self-testing process refers to a dischargeable capacity and discharge time at low power. The dischargeable capacity and the discharge time of the power backup unit at the rated power may be obtained according to the dischargeable capacity and the discharge time of the power backup unit at the low power and the relationship between the numerical values of the low power and the rated power. For example, a calculation method of an SOC and an SOH may be used to calculate the attenuation performance. According to the charge and discharge cycle of the load of the self-test resistor, a variation of the capacity, the internal resistance, etc. of the battery pack is obtained, and thus, the SOC and the SOH of the power backup unit at the low power are obtained. According to a conversion algorithm between a low-power discharge and a high-power discharge, the SOC and the SOH of the power backup unit at the rated power are obtained. A reference for calculating the dischargeable capacity and the discharge time of a power backup unit at the rated power is obtained by collecting the dischargeable capacity and the discharge time of the power backup unit in the self-test process, which reduces a calculation error, thereby improving the calculation precision and the calculation efficiency of the self-test.

Figure 6:
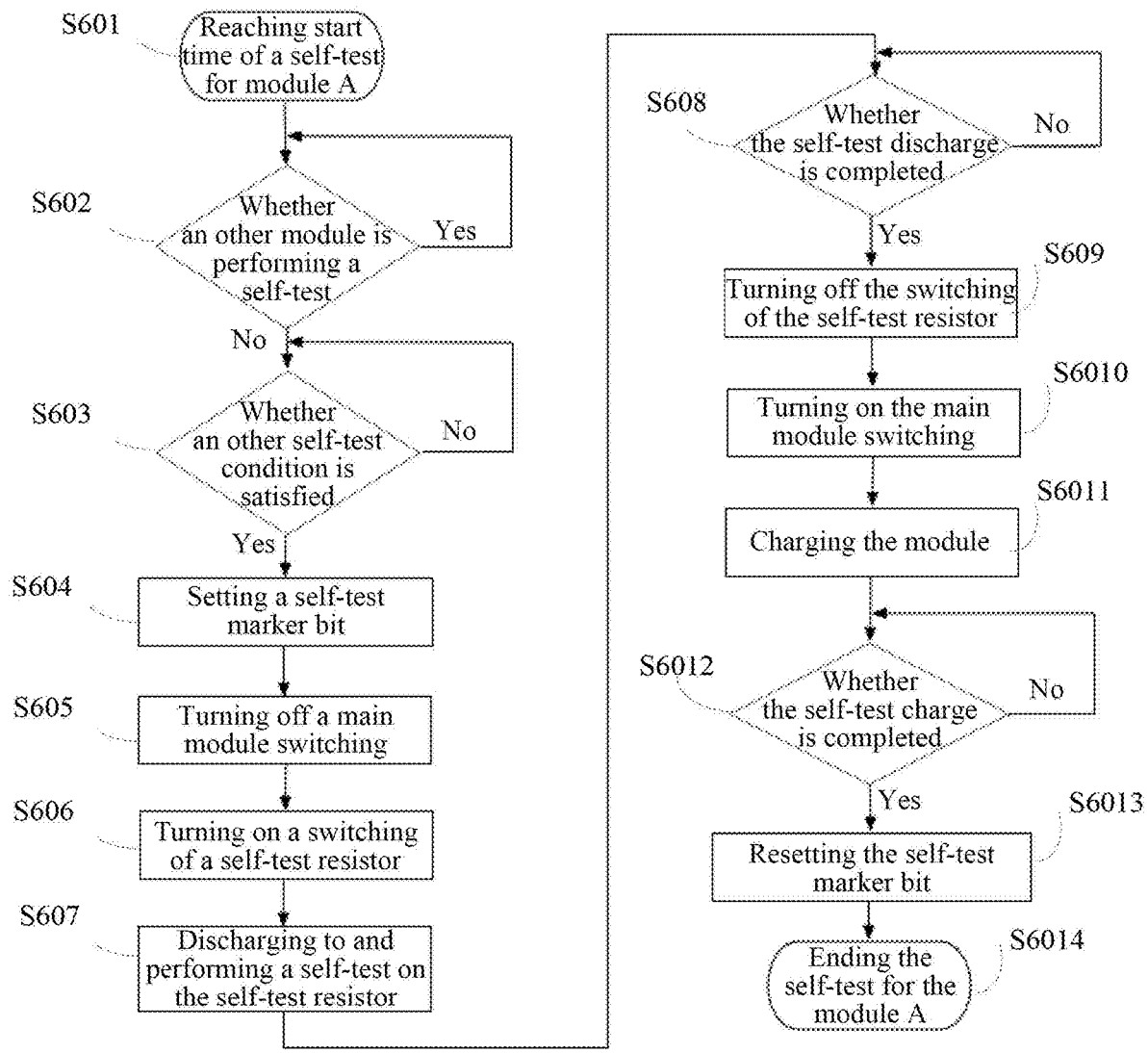
FIG. 6 is a flowchart of a self-test on a server cabinet power backup system according to an embodiment of the present disclosure.

FIG. 6 is a flowchart of a self-test on a server cabinet power backup system in this embodiment. This embodiment is further optimized on the basis of the above embodiment. In FIG. 6, module A represents the battery management module, and other modules represent modules such as the battery pack and the self-test resistor in the power backup unit, and a main module switching represents a switching between the battery pack and the charge loop.

S601, the battery management module senses that the self-test time is reached, and starts to prepare the self-test.

S602, the battery management module tests whether the power backup unit satisfies the self-test condition, first tests whether other modules in the power backup unit is performing the self-test, returns to the previous step to continue to perform the test if the self-test of other modules is being performed, and performs S603 if the other modules are not in a self-test state.

S603, the battery management module tests whether the power backup unit satisfy the self-test condition, and the self-test condition may include: the mains supply is normal, the power supply module of the server cabinet is normal, and the number of the power backup units is greater than the threshold value. If the self-test condition is not satisfied, the previous step is returned to, and if the self-test condition is satisfied, S604 is performed.

S604, the battery management module sets a self-test marker bit to represent that a self-test is being performed.

S605, the battery management module disconnects the connection between the battery pack and the charge loop, to stop charging the battery pack.

S606, the battery management module switches on a circuit switching between the self-test resistor and the battery pack.

S607, the battery pack discharges to the self-test resistor, and the battery management module collects a discharge parameter of the battery pack.

S608, if a battery level of the battery pack is 0%, a self-test discharge is completed; otherwise, the self-test discharge is not completed, and the previous step is returned to continue to perform the self-test discharge. If the self-test discharge is completed, S609 is performed.

S609, the battery management module disconnects a path between the battery pack and the self-test resistor, and the battery pack stops discharging to the self-test resistor.

S6010, the battery management module electronically communicates a path between the battery pack and the charge loop.

S6011, the battery pack is charged by the charge loop.

S6012, if a battery level of the battery pack is 100%, a self-test charge is completed; otherwise, the self-test charge is not completed, and the previous step is returned to continue to perform the self-test charge. If the self-test charge is completed, S6013 is performed.

S6013, the battery management module resets the self-test marker bit to represent that the self-test is not performed.

S6014, the self-test process of the battery management module for the power backup unit ends.

An embodiment of the present disclosure has the following advantages or beneficial effects: the battery management module controls the battery pack to be connected with or disconnected from the self-test resistor, so as to charge and discharge the battery pack, and the charge and discharge parameter may be collected. The charge and discharge parameter at the rated power may be obtained according to the charge and discharge parameter at the low power, thus obtaining the attenuation performance. This solves the problem in the existing technology that a test is manually performed on the battery. The self-test is completely and automatically performed through the power backup system, thus saving operation and maintenance costs. Each power backup unit operates independently and does not affect the stability of an other power backup unit or the server. By connecting the self-test resistor, the deep discharge of the battery pack may be implemented in the self-test process, and thus, the attenuation situation of the battery is completely understood, the accuracy of the self-test is improved, and the calculation precision is improved.

According to the technical solution of the embodiments of the present disclosure, the battery management module controls the battery pack to be connected with or disconnected from the self-test resistor, so as to charge and discharge the battery pack, and the charge and discharge parameter may be collected to calculate the performance of the battery. This solves the problem in the existing technology that a test is manually performed on the battery. The self-test is completely and automatically performed through the power backup system, thus saving operation and maintenance costs. Each power backup unit operates independently and does not affect the stability of an other power backup unit or the server. By connecting the self-test resistor, the deep discharge of the battery pack can be implemented in the self-test process, and thus, the attenuation situation of the battery is completely understood, the accuracy of the self-test is improved.

It should be understood that the steps of reordering, adding or deleting may be performed using the various forms shown above. For example, the steps described in the present disclosure may be performed in parallel or sequentially or in a different order, so long as the desired results of the technical solution disclosed in the present disclosure may be realized, and no limitation is imposed herein.

The foregoing detailed description is not intended to limit the scope of the present disclosure. It will be appreciated by those skilled in the art that various modifications, combinations, sub-combinations, and substitutions may be made depending on design requirements and other factors. Any modifications, equivalents, and modifications that fall within the spirit and principles of the present disclosure are intended to be included within the scope of the present disclosure.

What is claimed is:

1. A server cabinet power backup system, comprising:
a plurality of power backup units connected in parallel, wherein each power backup unit comprises a battery pack, a battery management module and a self-test resistor, and the self-test resistor is connected in parallel with a charge loop of the battery pack,
in a self-test process of the power backup unit, the battery management module is configured to: control the battery pack to supply power to the self-test resistor to discharge the battery pack, control the battery pack to be charged after the battery pack is discharged, and collect a charge and discharge parameter of the battery pack, and
the battery management module is further configured to: determine attenuation performance of the power backup unit according to the charge and discharge parameter of the battery pack, wherein a resistance value of the self-test resistor is determined according to at least one item of: a self-test discharge duration of the battery pack, heat generated by the self-test resistor in a discharge process, or a size of the power backup unit.

2. The system according to claim 1, wherein the battery management module is configured to control the battery pack to be fully charged and fully discharged.

3. The system according to claim 2, wherein the power backup unit further comprises a switching circuit,
the battery management module is configured to: through the switching circuit, control the battery pack to be disconnected from a bus of a server load and control the battery pack to be electronically communicated with the self-test resistor to discharge the battery pack using the self-test resistor, and
after the battery pack is discharged, the battery management module is further configured to: through the switching circuit, control the battery pack to be disconnected from the self-test resistor, and control the battery pack to be electronically communicated with the charge loop to charge the battery pack using the charge loop.

4. The system according to claim 1, wherein the power backup unit further comprises a switching circuit,
the battery management module is configured to: through the switching circuit, control the battery pack to be disconnected from a bus of a server load and control the battery pack to be electronically communicated with the self-test resistor to discharge the battery pack using the self-test resistor, and
after the battery pack is discharged, the battery management module is further configured to: through the switching circuit, control the battery pack to be disconnected from the self-test resistor, and control the battery pack to be electronically communicated with the charge loop to charge the battery pack using the charge loop.

5. The system according to claim 1, wherein,
the battery management module is further configured to determine whether a self-test condition of the power backup unit is satisfied responsive to determining that the self-test time of the power backup unit is reached, and
in response to determining that the self-test condition is satisfied, the battery management module is further configured to perform a self-test operation on the power backup unit.

6. The system according to claim 5, wherein
the battery management module is configured to determine that the self-test condition of the power backup unit is satisfied in response to the battery management module determining that a mains supply is normal, a power supply module of a server cabinet being normal, and a number of available power backup units in the power backup system being greater than a threshold value.

7. The system according to claim 1, wherein:
the battery management module is configured to determine a dischargeable capacity and discharge time of the power backup unit in the self-test process according to the charge and discharge parameter of the battery pack, and
the battery management module is further configured to determine a dischargeable capacity and discharge time of the power backup unit at rated power according to the dischargeable capacity and the discharge time of the power backup unit in the self-test process.

8. A method for testing a server cabinet power backup system, performed by the server cabinet power backup system, wherein the server cabinet power backup system comprises a plurality of power backup units connected in parallel, each power backup unit comprises a battery pack, a battery management module and a self-test resistor, the self-test resistor is connected in parallel with a charge loop of the battery pack, the method comprising:
in a self-test process of the power backup unit, controlling, by the battery management module, the battery pack to supply power to the self-test resistor to discharge the battery pack, controlling the battery pack to be charged after the battery pack is discharged, and collecting a charge and discharge parameter of the battery pack, and
determining, by the battery management module, attenuation performance of the power backup unit according to the charge and discharge parameter of the battery pack,
wherein a resistance value of the self-test resistor is determined according to at least one item of: a self-test discharge duration of the battery pack, heat generated by the self-test resistor in a discharge process, or a size of the power backup unit.

9. The method according to claim 8, wherein controlling, by the battery management module, the battery pack to supply power to the self-test resistor to discharge the battery pack, and controlling the battery pack to be charged after the battery pack is discharged comprises:

controlling, by the battery management module, the battery pack to supply power to the self-test resistor to discharge the battery pack, and controlling the battery pack to be charged until the battery pack is fully charged, after the battery pack is fully discharged.

10. The method according to claim 9, wherein the power backup unit further comprises a switching circuit, and controlling, by the battery management module, the battery pack to supply power to the self-test resistor to discharge the battery pack, and controlling the battery pack to be charged after the battery pack is discharged comprises:

through the switching circuit, controlling, by the battery management module, the battery pack to be disconnected from a bus of a server load, and controlling the battery pack to be electronically communicated with the self-test resistor to discharge the battery pack using the self-test resistor; and after the battery pack is discharged, through the switching circuit, controlling, by the battery management module, the battery pack to be disconnected from the self-test resistor, and controlling the battery pack to be communicated with the charge loop to charge the battery pack using the charge loop.

11. The method according to claim 8, wherein the power backup unit further comprises a switching circuit, and controlling, by the battery management module, the battery pack to supply power to the self-test resistor to discharge the battery pack, and controlling the battery pack to be charged after the battery pack is discharged comprises:

through the switching circuit, controlling, by the battery management module, the battery pack to be disconnected from a bus of a server load, and controlling the battery pack to be electronically communicated with the self-test resistor to discharge the battery pack using the self-test resistor; and after the battery pack is discharged, through the switching circuit, controlling, by the battery management module, the battery pack to be disconnected from the self-test resistor, and controlling the battery pack to be communicated with the charge loop to charge the battery pack using the charge loop.

12. The method according to claim 8, further comprising:

determining, by the battery management module, whether a self-test condition of the power backup unit is satisfied responsive to determining that the self-test time of the power backup unit is reached, and in response to the self-test condition being satisfied, performing, by the battery management module, a self-test operation on the power backup unit.

13. The method according to claim 12, wherein determining whether the self-test condition of the power backup unit is satisfied comprises:

determining that the self-test condition of the power backup unit is satisfied in response to the battery management module determining that a mains supply is normal, a power supply module of a server cabinet being normal, and a number of available power backup units in the power backup system being greater than a threshold value.

14. The method according to claim 8, wherein determining, by the battery management module, attenuation performance of the power backup unit according to the charge and discharge parameter of the battery pack comprises:

determining, by the battery management module, a dischargeable capacity and discharge time of the power backup unit in the self-test process according to the charge and discharge parameter of the battery pack, and determining, by the battery management module, a dischargeable capacity and discharge time of the power backup unit at rated power according to the dischargeable capacity and the discharge time of the power backup unit in the self-test process.

* * * * *